US 6,621,843 B2

(12) United States Patent
Yoo et al.

(10) Patent No.: US 6,621,843 B2
(45) Date of Patent: Sep. 16, 2003

(54) LONG WAVELENGTH SURFACE-EMITTING SEMICONDUCTOR LASER DEVICE AND METHOD FOR MANUFACTURING THE SAME

(75) Inventors: Byueng-Su Yoo, Taejon (KR); O-Kyun Kwon, Taejon (KR); Young-Gu Ju, Taejon (KR)

(73) Assignee: Electronics and Telecommunications Research Institute (KR)

( * ) Notice: Subject to any disclaimer, the term of this patent is extended or adjusted under 35 U.S.C. 154(b) by 92 days.

(21) Appl. No.: 09/842,521

(22) Filed: Apr. 25, 2001

(65) Prior Publication Data

US 2002/0075922 A1 Jun. 20, 2002

(30) Foreign Application Priority Data

Dec. 14, 2000 (KR) ........................................ 2000-76661

(51) Int. Cl.$^7$ ................................................. H01S 5/00
(52) U.S. Cl. ............................. 372/45; 372/46; 372/68; 372/99; 372/103; 372/107
(58) Field of Search ............................ 372/45, 98, 99, 372/103, 107, 68, 46

(56) References Cited

U.S. PATENT DOCUMENTS

| 4,888,784 | A | * | 12/1989 | Hirata .......................... 372/45 |
| 5,432,809 | A | | 7/1995 | Grodzinski et al. |
| 5,594,751 | A | | 1/1997 | Scott |
| 5,717,707 | A | * | 2/1998 | Beernink et al. .............. 372/45 |
| 5,818,861 | A | * | 10/1998 | Tan et al. ...................... 372/46 |
| 5,883,912 | A | | 3/1999 | Ramdani et al. |
| 6,064,683 | A | * | 5/2000 | Johnson ........................ 372/43 |
| 6,091,504 | A | * | 7/2000 | Walker et al. ................ 250/343 |
| 6,287,884 | B1 | * | 9/2001 | Jie et al. ........................ 438/39 |

OTHER PUBLICATIONS

Pulse Operation and Threshold Characteristics of 1.55–um In A1FAAs–InA1As VCSELs; by O.K. Kwon et al. IEEE pp. 1132–1134, col. 12, No. 9 Sep. 2000.
+55 C pulse Iasing at 1.56 um of all–monolithic . . . C. Kazmierski, et al. Electronics Letters, pp. 811–812, May 13, 1999, vol. 35 No. 10.
Room–temperature, electrically–pumped multiple active region . . . by J.K. Kim et al. Electronics Letters, pp. 1084–1085, Jun. 24, 1999 vol. 35 No. 13.
Room–temperature CW operation of Lattice–matched long–wavelength VCSELs by E. Hall et al. Electronics Letters, pp. 1465–1467, Aug. 17, 2000, vol. 36, No. 17.

\* cited by examiner

*Primary Examiner*—Eddie Lee
*Assistant Examiner*—Matthew E. Warren
(74) *Attorney, Agent, or Firm*—Blakely, Sokoloff, Taylor & Zafman (57) ABSTRACT

Disclosed is a surface-emitting laser device which eliminates an absorption loss of a p-type doped layer and reduces a scattering loss in a mirror layer and a carrier loss due to a current induction, comprising a first conductive type of semiconductor substrate; a bottom mirror layer formed on the semiconductor substrate and composed of a first conductive type of semiconductor layer; an active layer formed on the bottom mirror layer; an electron leakage barrier layer formed on the active layer and having an energy gap larger than the active layer; a current induction layer formed on the electron leakage barrier layer and a second conductive type of semiconductor layer; a current extension layer formed on the current induction layer and composed of the second conductive type of semiconductor layer; and a top mirror layer formed on the current extension layer, wherein the top mirror layer includes undoped center portion and its both end having the second conductive type of dopant diffusion region.

30 Claims, 8 Drawing Sheets

LONG WAVELENGTH SURFACE-EMITTING SEMICONDUCTOR LASER DEVICE AND METHOD FOR MANUFACTURING THE SAME

FIELD OF THE INVENTION

The present invention relates to a long wavelength surface-emitting semiconductor laser device with an emission wavelength of 1.3 to 1.6 micrometers; and, more particularly, to a high efficiency of Zn diffusion long wavelength surface-emitting laser has the ability to prevent an absorption loss in a resonator and effectively adjust a current flow.

DESCRIPTION OF THE PRIOR ART

The long wavelength surface-emitting laser is very available as a light source for short and long distance communications. In particular, such long wavelength surface-emitting laser with a high optical fiber coupling efficiency, a low unit cost by wafer-based fabrication, two-dimensional array characteristics and so on may be contemplated as a major light source for next generation optical communications and signal processing.

Since, however, the long wavelength surface-emitting laser has a lower energy of oscillation wavelength compared to a surface-emitting laser with an emission wavelength of 850 nm and 980 nm, it suffers from drawbacks including a high absorption loss due to a low quantum efficiency, a doping and so on, a low thermal conductivity of component materials and a structure fabrication for a high efficiency of uniform current induction.

A description of a structure of the conventional long wavelength surface-emitting laser and a problem thereof will be given with reference to FIG. 1.

Figure 1:
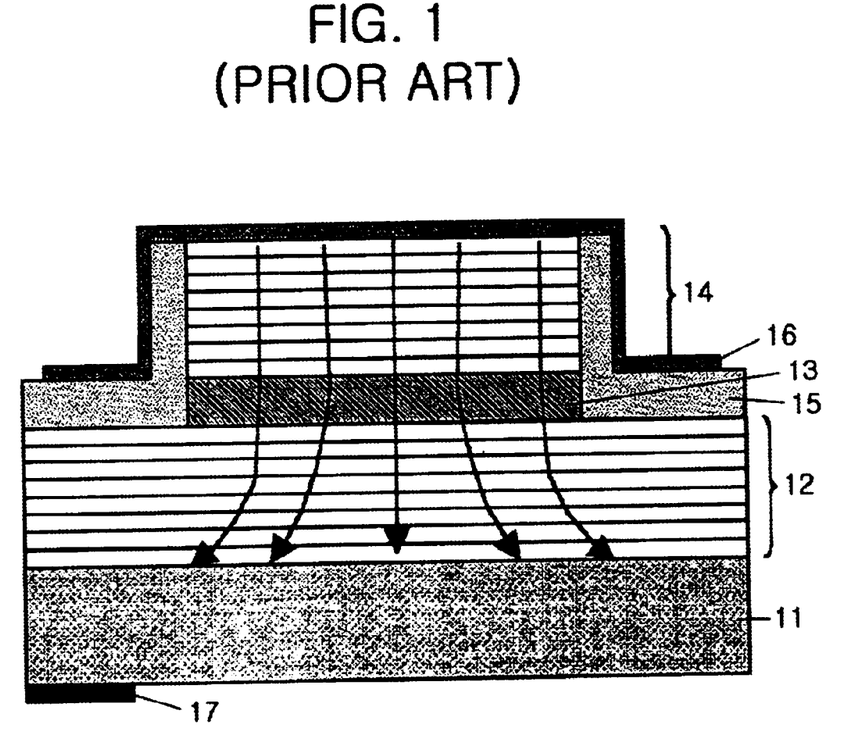
FIG. 1 shows a cross sectional view setting forth the structure of the conventional long wavelength surface-emitting laser grown in a general internal defect-free monolithic structure.

FIG. 1 is a cross sectional view setting forth the structure of the conventional long wavelength surface-emitting laser grown in a general internal defect-free monolithic structure. As shown in FIG. 1, formed on an InP semiconductor substrate 11 for growing a laser structure with an emission wavelength of 1.3 to 1.6 μm is an n-type bottom mirror layer 12; an active layer 13 covering a portion of the surface of the n-type bottom mirror layer 12; a p-type top mirror layer 14 disposed on top of the active layer 13, making a laser column; an insulating film 15 for covering a side of the active layer 13 and the p-type top mirror layer 14, and the n-type bottom mirror layer 12 which is not covered with the active layer 13 and a first metal electrode 16 connected with the p-type top mirror layer 14. A second metal electrode 17 is connected with the reverse side of the InP semiconductor substrate 11.

Each of the p-type top mirror layer 14 and the n-type bottom mirror layer 12 is a multi-layered semiconductor Distributed Bragg Reflector ("DBR") doped with p and n type impurities, respectively, which is composed of a multi-layered structure implemented by alternatively growing two materials having different indices of refraction, and an InAlGaAs/InAlAs or InGaAsP/InP lattice matched to InP. The active layer 13 is composed of a quantum well structure adapted for a long wavelength with an oscillation wavelength of 1.3 μm to 1.6 μm.

The application of current between the first and second metal electrodes 16 and 17 in the long wavelength surface-emitting laser with the structure shown in FIG. 1 allows a current to be induced through an etched laser column, resulting in a gain of the active layer 13 thereby undergoing an oscillation.

For the current application, each of the p-type top mirror layer 14 and the n-type bottom mirror layer 12 are doped with p and n type impurities so that injection of hole and electron is possible. The n-type bottom mirror layer 12 and the p-type top mirror layer 14 are composed of a multilayer of heterojunction, causing the discontinuity of valence and conduction bands in interface. Thus, high doping concentration ranging from $1 \times 10^{18}$ cm$^{-3}$ to $5 \times 10^{18}$ cm$^{-3}$ is necessary to eliminate a resistance. Unfortunately, free carrier absorption rapidly increases with a higher concentration, resulting in a suddenly increased threshold gain for laser oscillation. Decreasing the doping concentration to eliminate the free carrier absorption loss results in an increased series resistance, increasing the threshold voltage to thereby generate a high thermal, which, in turn, rapidly decreases the oscillation efficiency.

Such a problem, i.e., an increase in resistance due to the heterojunction and an increase in absorption loss due to the doping, may be mostly occurred at the p-type top mirror layer 14 in which a current flows by the hole. The problem results in degraded characteristics of threshold current, output and operation temperature.

On the other side, in the structure of the long wavelength surface-emitting laser shown in FIG. 1, since a current is induced by the column formed by etch, it suffers from drawbacks including a scattering loss in the etched surface and a surface recombination loss in surface of the active layer by the current injection.

SUMMARY OF THE INVENTION

It is, therefore, a primary object of the present invention to provide a high efficiency of long wavelength surface-emitting laser device and method, in a resonator of long wavelength surface-emitting semiconductor laser device with an emission wavelength of 1.3 to 1.6 micrometers, which is capable of eliminating an absorption loss of a p-type doped layer and reducing a scattering loss in a mirror layer and a carrier loss due to a current induction.

In accordance with one aspect of the present invention, there is provided a surface-emitting laser device, comprising: a first conductive type of semiconductor substrate; a bottom mirror layer formed on the semiconductor substrate and composed of a first conductive type of semiconductor layer; an active layer formed on the bottom mirror layer; an electron leakage barrier layer formed on the active layer and having an energy gap larger than the active layer; a current induction layer formed on the electron leakage barrier layer and a second conductive type of semiconductor layer; a current extension layer formed on the current induction layer and composed of the second conductive type of semiconductor layer; and a top mirror layer formed on the current extension layer, wherein the top mirror layer includes undoped center portion and its both end having the second conductive type of dopant diffusion region.

In accordance with another aspect of the present invention, there is provided a method for manufacturing a surface-emitting laser device, comprising: a first conductive type of semiconductor substrate; a bottom mirror layer formed on the semiconductor substrate and composed of a first conductive type of semiconductor layer; an active layer formed on the bottom mirror layer; a current extension layer formed on the active layer and composed of the second conductive type of semiconductor layer; and a top mirror layer formed on the current extension layer, wherein the top mirror layer includes undoped center portion and its both end having the second conductive type of dopant diffusion region.

In accordance with still another aspect of the present invention, there is provided a method for the fabrication of a surface-emitting laser device, comprising the steps of: (a) forming a bottom mirror layer composed of a first conductive type of semiconductor layer on a first conductive type of semiconductor substrate; (b) disposing an active layer on the bottom mirror layer; (c) sequentially forming on the active layer an electron leakage barrier layer, a current induction layer and a current extension layer each of which is composed of a second conductive type of semiconductor layer; (d) forming a top mirror layer composed of an undoped semiconductor layer on the current extension layer; (e) forming a mask pattern on the top mirror layer; (f) selectively etching a portion of the top mirror layer using the mask pattern as an etch mask to thereby form a laser column composed of the top mirror layer; (g) forming the second conductive type of dopant diffusion layer at both ends of the top mirror layer using the mask pattern as an etch mask; (h) etching the top mirror layer and the current extension layer using the mask pattern as the etch mask, until the current induction layer is exposed; (i) wet etching the current induction layer to form a pattern which overlaps with the top mirror layer at between the second conductive type of dopant diffusion layers; and (j) removing the mask pattern.

In accordance with still another aspect of the present invention, there is provided a method for the fabrication of a surface-emitting laser device, comprising the steps of: (a) forming a bottom mirror layer composed of a first conductive type of semiconductor layer on a first conductive type of semiconductor substrate; (b) disposing an active layer on the bottom mirror layer; (c) forming a current extension layer composed of a second conductive type of semiconductor layer on the active layer; (d) forming a top mirror layer composed of an undoped semiconductor layer on the current extension layer; (e) forming a mask pattern on the top mirror layer; (f) selectively etching a portion of the top mirror layer using the mask pattern as an etch mask to thereby form a laser column composed of the top mirror layer; (g) forming the second conductive type of dopant diffusion layer at both ends of the top mirror layer using the mask pattern as an etch mask; (h) etching the top mirror layer and the current extension layer using the mask pattern as the etch mask, until the active layer is exposed; (i) wet etching the active layer to form a pattern which overlaps with the top mirror layer at between the second conductive type of dopant diffusion layers; and (j) removing the mask pattern.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 2:
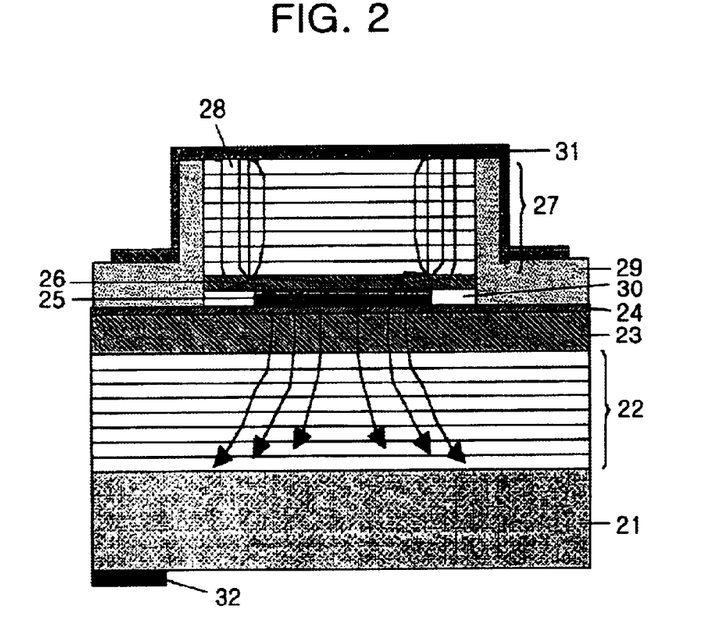
FIG. 2 is a cross sectional view setting forth a structure of Zn diffusion long wavelength surface-emitting laser device in accordance with a preferred embodiment of the present invention.

FIG. 2 is a cross sectional view setting forth a structure of Zn diffusion long wavelength surface-emitting laser device in accordance with a preferred embodiment of the present invention.

As shown in FIG. 2, formed on an n-type InP semiconductor substrate 21 is a bottom mirror layer bottom mirror layer 22, an active layer 23, an electron leakage barrier layer 24, a current induction layer 25 composed of a p-type semiconductor, a current extension layer 26, a top mirror layer 27, a Zn diffusion region 28, an insulating layer 29, and a first metal electrode 31.

The bottom mirror layer 22 is composed of a multi-layered semiconductor Distributed Bragg Reflector ("DBR") that is formed by alternatively layering two semiconductor layers having different indices of refraction. The active layer 23 is composed of a quantum well layer and a space layer for a laser gain. The electron leakage barrier layer 24 serves to cover a portion of the active layer 23 and has an energy gap larger than the quantum well layer and the space layer of the active layer 23. The current extension layer 26 composed of a p-type semiconductor is formed on the current induction layer 25 and has a larger area than the current induction layer 25. The top mirror layer 27 is composed of an undoped semiconductor DBR layered on the current extension layer 26. The Zn diffusion region 28 is formed at one end and the other end of the top mirror layer 27 and has its bottom surface contacted with the current extension layer 26. The insulating layer 29 covers each side well of the top mirror layer 27 and the current extension layer 26 to thereby provide an air layer 30 between the current extension layer 26, the current induction layer 25 and the electron leakage barrier layer 24. The first metal electrode 31 is connected with the top mirror layer 27. The second metal electrode 32 is connected with the reverse side of the InP semiconductor substrate 21.

Figure 3:
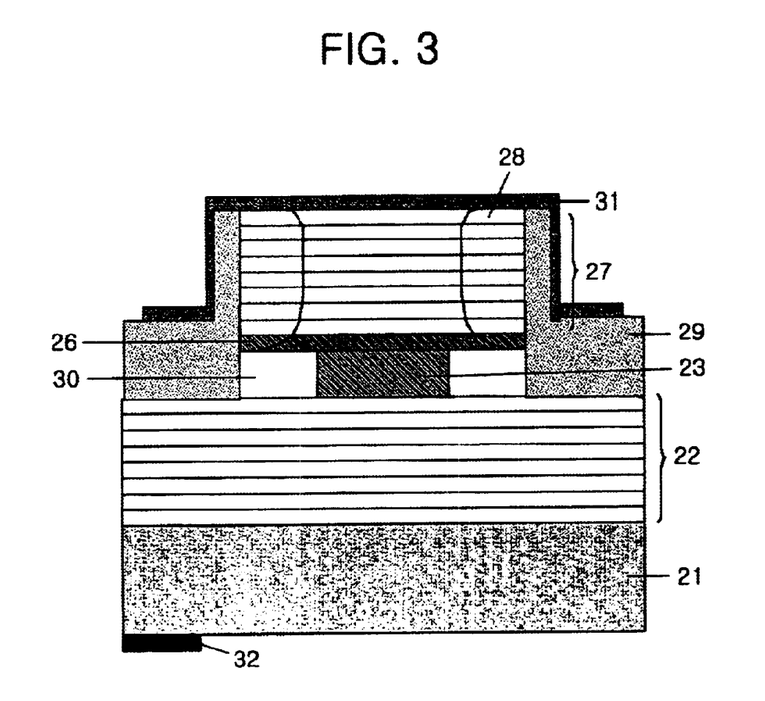
FIG. 3 is a cross sectional view setting forth a structure of Zn diffusion long wavelength surface-emitting laser device in accordance with another preferred embodiment of the present invention.

FIG. 3 is a cross sectional view setting forth a structure of Zn diffusion long wavelength surface-emitting laser device in accordance with another preferred embodiment of the present invention.

As shown in FIG. 3, formed on an n-type InP semiconductor substrate 21 is a bottom mirror layer 22, an active layer 23, a current extension layer 26, a top mirror layer 27, a Zn diffusion region 28, an insulating layer 29, and a first metal electrode 31.

The bottom mirror layer 22 is composed of a multi-layered semiconductor DBR that is formed by alternatively layering two semiconductor layers having different indices of refraction. The active layer 23 composed of a quantum well layer and a space layer for a laser gain covers a portion of the bottom mirror layer 22. The current extension layer 26 composed of a p-type semiconductor is formed on the active layer 23 and has a larger area than the active layer 23. The top mirror layer 27 is composed of an undoped semiconductor DBR layered on the current extension layer 26. The Zn diffusion region 28 is formed at one end and the other end of the top mirror layer 27 and has its bottom surface contacted with the current extension layer 26. The insulating layer 29 covers a sidewall of the top mirror layer 27 and a portion of the surface of the active layer 23 and provides an air layer 30 between the current extension layer 26, the active layer 23 and the bottom mirror layer 22. The first metal electrode 31 is connected with the top mirror layer 27. A second metal electrode 32 is connected with the reverse side of the InP semiconductor substrate 21.

In the structure shown in FIGS. 2 and 3, the active layer 23 has a multi-layered structure implemented by alternatively growing semiconductor thin films having different indices of refraction such as an InAlAs/InAlGaAs, InGaAsP/InP, $In_x(Al_yGa_{1-y})As/In_{x'}(Al_{y'}Ga_{1-y'})_{1-x'}As$ and $In_xGa_{1-x}As_yP_{1-y}/In_{x'}Ga_{1-x'}As_{y'}P_{1-y'}$, in which an n-type semiconductor DBR layer is lattice-matched to InP, wherein x, x', y and y' are real numbers between zero and one, respectively, and x≠x' and y≠y'.

A thickness of one cycle is set to be ½ integral multiples of a laser oscillation wavelength as an optical length defined by the following equation (1):

$$\text{Optical length} = \text{thickness of material} \times \text{refractive index at the oscillation wavelength} \quad \text{Eq. (1)}$$

And, the active layer 23 composed of the quantum well layer and the space layer is configured to have its total thickness, which is set to be ½ integral multiples of the laser oscillation wavelength as the optical length.

The current induction layer 25 composed of a p-type semiconductor layer is formed of an InAlGaAs, InP or InGaAsP lattice matched to InP, and the top mirror layer 27, the active layer 23, the electron leakage barrier layer 24 and the current extension layer 26 are formed of compound semiconductors such as InP, InGaAsP or InAlGaAs lattice matched to InP having a different composition, thereby facilitating a selective etching process to allow the air layer 30 to be formed. A width of the current induction layer 25 is configured to be in the range of 5 to 50 micrometers in width.

The top mirror layer 27 is formed of an InAlAs/InAlGaAs, InGaAsP/InP, $In_x(Al_yGa_{1-y})As/In_{x'}(Al_{y'}Ga_{1-y'})_{1-x'}As$ or $In_xGa_{1-x}As_yP_{1-y}/In_{x'}Ga_{1-x'}As_{y'}P_{1-y'}$ in which an undoped semiconductor layer is lattice-matched to InP, wherein x, x', y and y' are real numbers between zero and one, respectively, and x≠x' and y≠y' for the elimination of the absorption loss. The top mirror layer 27 is formed in a column shape. Both ends of the top mirror layer 27 include the Zn diffusion region 28 having a p-type characteristic with a high conductivity of hole for the current injection. Further, in order to reduce scattering losses in interface, the current induction layer 25 is overlapped with the top mirror layer 27 with not overlapped with the Zn diffusion region 28.

Each of the first metal electrode 31 and the second metal electrode 32 are formed of Ti/Pt/Au, Ti/Au or Au, and AuGe/Ni/Au or Au, respectively.

In the Zn diffusion long wavelength surface-emitting laser device with the structure shown in FIG. 2, a current injected from the first metal electrode 31 passes through the Zn diffusion region 28 of the top mirror layer 27 and flows the current extension layer 26 and the current induction layer 25 to thereby flow to the active layer 23. In this case, the current injection region of the laser depends on the current induction layer 25.

In the Zn diffusion long wavelength surface-emitting laser device with the structure shown in FIG. 3, a current injected from the first metal electrode 31 passes through the Zn diffusion region 28 of the top mirror layer 27 and flows the current extension layer 26 to thereby flow to the active layer 23. In this case, the current injection region of the laser depends on the active layer 23.

In the Zn diffusion long wavelength surface-emitting laser device with the structure shown in FIGS. 2 and 3, since the center of the top mirror layer 27 is not doped, it prevents from optical absorption losses to allow a laser oscillation. If a sectional area of the laser column of the top mirror layer 27 is formed to be larger than that of the current induction layer 25 in FIG. 2 and that of the active layer 23 in FIG. 3, it is possible to eliminate the scattering loss to be occurred at the interface between the laser column and the insulating film or air. Since, in the electrical aspect, the Zn diffusion region 28 can be doped up to the range of $2 \times 10^{18}$ to $50 \times 10^{18}$ cm$^{-3}$, a resistance may be decreased during the current injection, which, in turn, minimizes unnecessary power consumption and thermal generation, thereby fabricating a surface-emitting laser device with a high temperature oscillation.

FIGS. 4A to 4E are schematic cross sectional views setting forth a method for the fabrication of the Zn diffusion long wavelength surface-emitting laser device with the structure shown in FIG. 2 in accordance with the present invention.

Figure 4A:
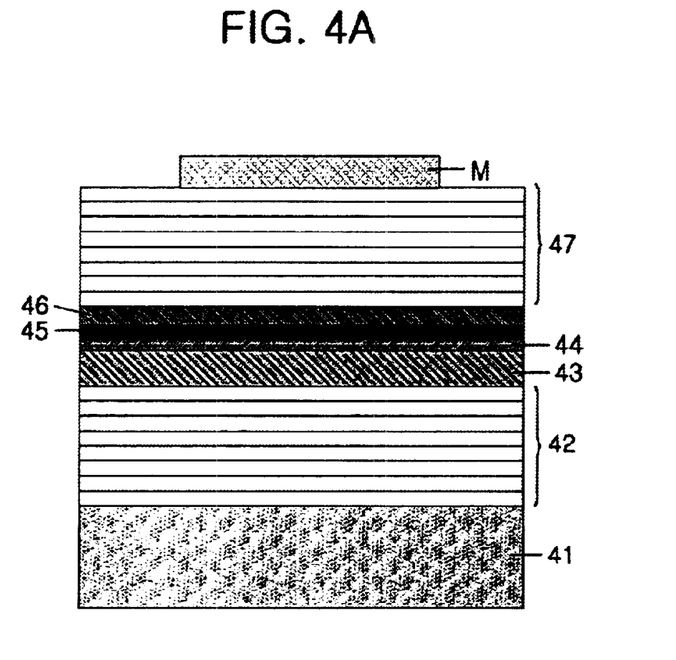
FIGS. 4A to 4E are schematic cross sectional views setting forth a method for the fabrication of the Zn diffusion long wavelength surface-emitting laser device with the structure shown in FIG. 2 in accordance with a preferred embodiment of the present invention.

As shown in FIG. 4A, disposed on an n-type InP semiconductor substrate 41 are a bottom mirror layer 42 composed of a DBR layer which is lattice matched to InP and is formed by alternatively stacking n-type thin film semiconductor layers having different indices of refraction, an active layer 43 composed of a quantum well layer and a space layer, an electron leakage barrier layer 44, a current induction layer 45, a current extension layer 46 and a top mirror layer 47 composed of a DBR formed by alternatively stacking undoped thin film semiconductors having different indices of refraction. SiNx dielectric thin film is deposited and patterned on top of the top mirror layer 47, to thereby form a mask pattern ("M") defining a laser column pattern.

Figure 4B:
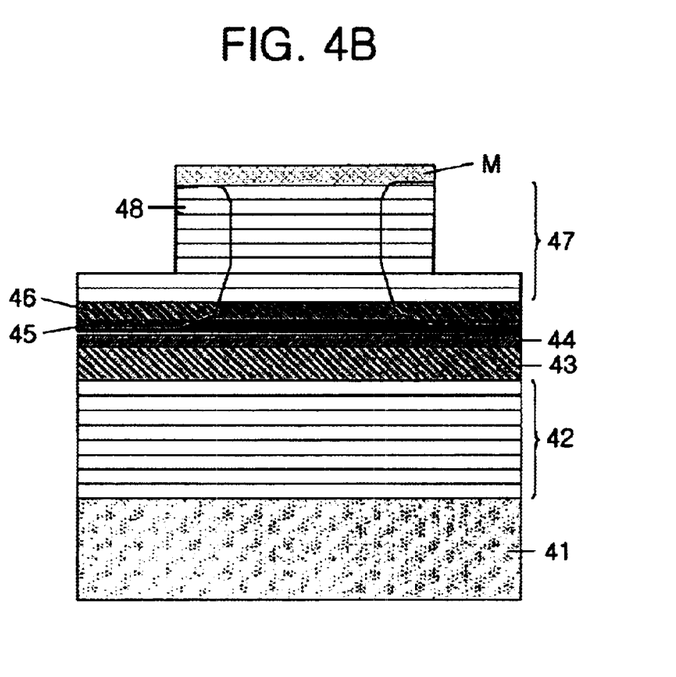

In an ensuing step, a portion of the thickness of the top mirror layer 47 is selectively etched by an ion (beam) etching process employing $BCl_3$, $Cl_2$, $CH_4$, $H_2$ or Ar as gas, thereby forms a laser column as shown in FIG. 4B. Thereafter, Zn is diffused to both ends of the top mirror layer 47 on the order of 1 to 10 micrometers in depth through the use of the mask pattern as a diffusion mask, thereby forming a Zn diffusion region 48 having its bottom surface contacted with the p-type current extension layer 46. The Zn diffusion region 48 is formed by the heat-treatment at temperatures ranging from 400° C. to 500° C. together with a sample and $Zn_3P_2$, allowing Zn to be diffused into the sample.

Figure 4C:
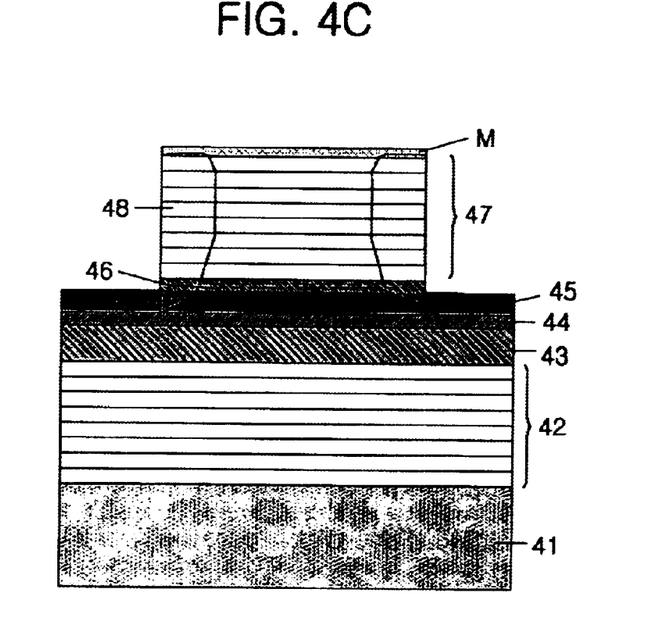

After the above step, the top mirror layer 47 and the current extension layer 46 are etched until the current induction layer 45 is exposed, through the use of an ion (beam) etching process employing $BCl_3$, $Cl_2$, $CH_4$, $H_2$ or Ar as gas, and the mask pattern as an etch mask, as shown in FIG. 4C.

Figure 4D:
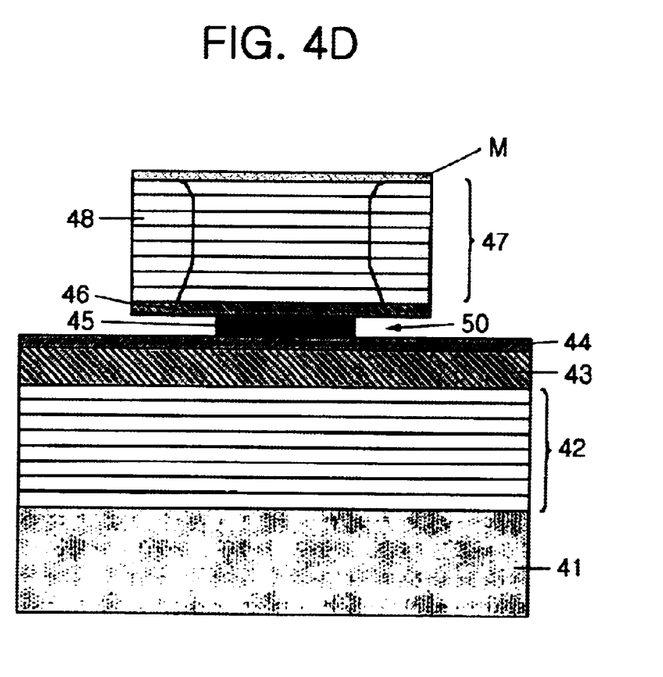

Subsequently, a portion of the current induction layer 45 is selectively etched using a wet etching process, as shown in FIG. 4D. The remaining portion of the current induction layer 45 after the wet etching process allows it to be overlapped with the undoped top mirror layer 47 at between the Zn diffusion regions. Specifically, the current induction layer 45 is etched to have a small width relative to that of a region where no Zn is diffused within the top mirror layer 47, thereby providing the air layer 50 between the current induction layer 45, the current extension layer 46 and electron leakage barrier layer 44.

In the case the current induction layer 45 is made of InP or InGaAsP, and each of the top mirror layer 47, the electron leakage barrier layer 44 and the current extension layer 46 is made of InAlGaAs, the wet etching process utilizes a mixed solution of HCl, $H_2O$ and $H_2O_2$ to selectively etch the current induction layer 45. Further, In the case the current induction layer 45 is made of InAlGaAs, and each of the top mirror layer 47, the electron leakage barrier layer 44 and the current extension layer 46 is made of InP or InGaAsP, the wet etching process utilizes a mixed solution of $H_3PO_4$, $H_2O$ and $H_2O_2$ to selectively etch the current induction layer 45.

Figure 4E:
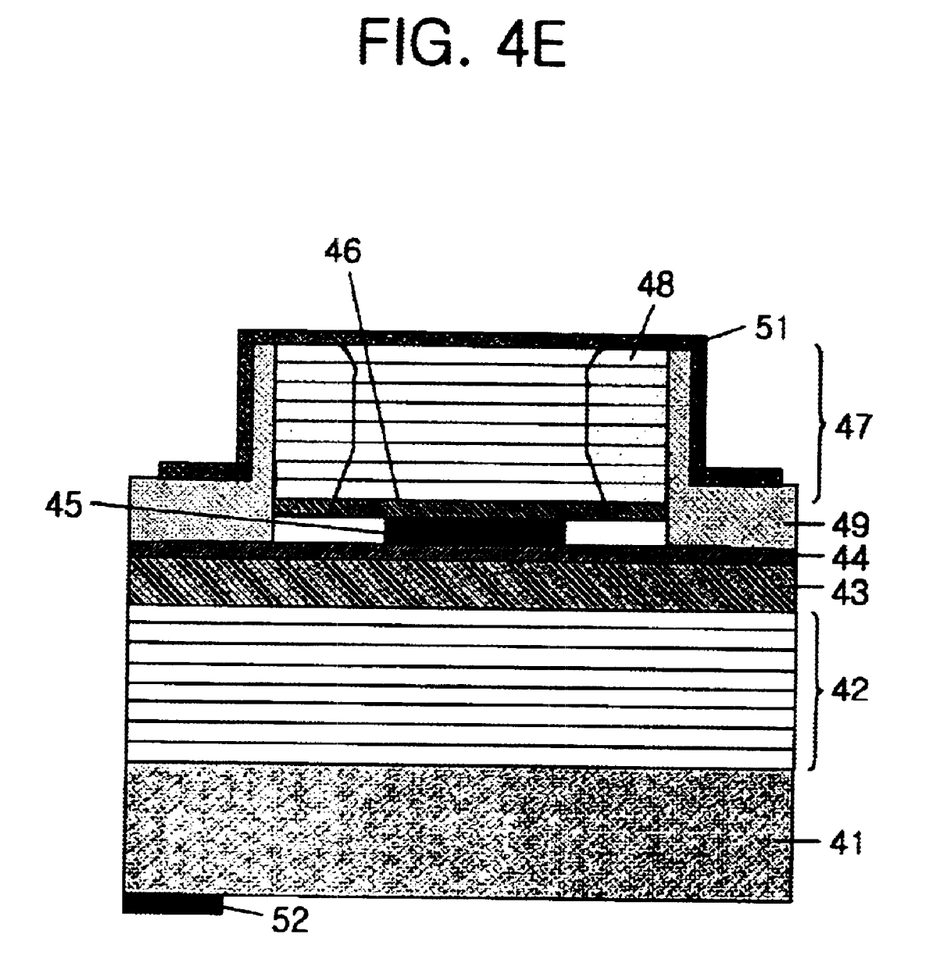

In a subsequent step, as shown in FIG. 4E, the mask pattern M is etched for the removal thereof and then the insulating layer 49 is formed on the overall structure obtained so, wherein the insulating layer 49 is made of a dielectric film or polyimide. And then, the insulating layer 49 is selectively etched to form a pattern which covers a side wall of the top mirror layer 47 and the current extension layer 46 and a surface of the electron leakage barrier layer 44, thereby providing the air layer 50 between the current extension layer 46, the current induction layer 45 and the electron leakage barrier layer 44. After that, a first metal electrode 51 made of Au, Ti/Au or Ti/Pt/Au is connected with the top mirror layer 47 and the reverse side of the InP semiconductor substrate 41 is polished to form a second metal electrode 52 connected with the reverse side. Alternatively, a dielectric thin film may be formed at other place than the second metal electrode 52 to decrease reflection of light from the reverse side according to the reflectivity of the reverse side of the n-type InP semiconductor substrate 41.

FIGS. 5A to 5E are schematic cross sectional views setting forth a method for the fabrication of the Zn diffusion long wavelength surface-emitting laser device with the structure shown in FIG. 3 in accordance with the present invention.

Figure 5A:
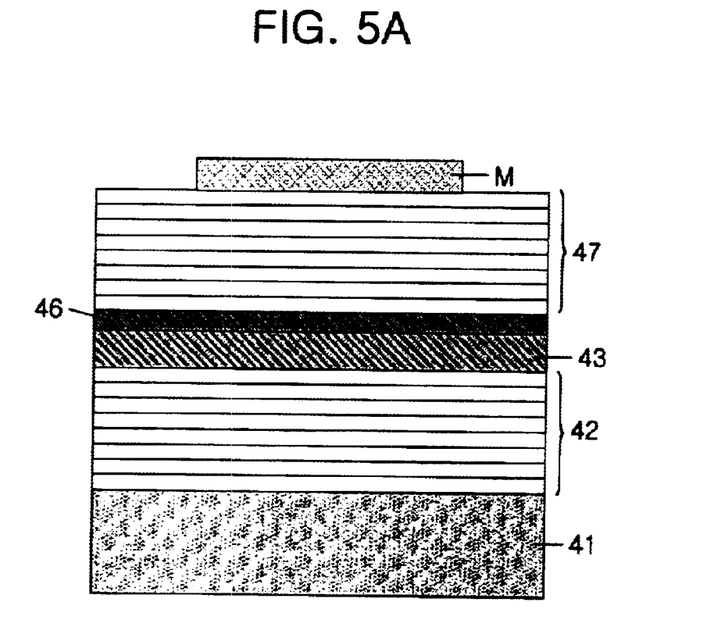
FIGS. 5A to 5E are schematic cross sectional views setting forth a method for the fabrication of the Zn diffusion long wavelength surface-emitting laser device with the structure shown in FIG. 3 in accordance with another preferred embodiment of the present invention.

As shown in FIG. 5A, disposed on an n-type InP semiconductor substrate 41 are a bottom mirror layer 42 composed of a DBR layer which is lattice matched to InP and is formed by alternatively stacking n-type thin film semiconductor layers having different indices of refraction, an active layer 43 composed of a quantum well layer and a space layer, a current extension layer 46 and a top mirror layer 47 composed of a DBR formed by alternatively stacking undoped semiconductor thin films having different indices of refraction. A SiNx dielectric thin film is deposited and patterned on top of the top mirror layer 47, to thereby form a mask pattern ("M") defining a laser column pattern.

Figure 5B:
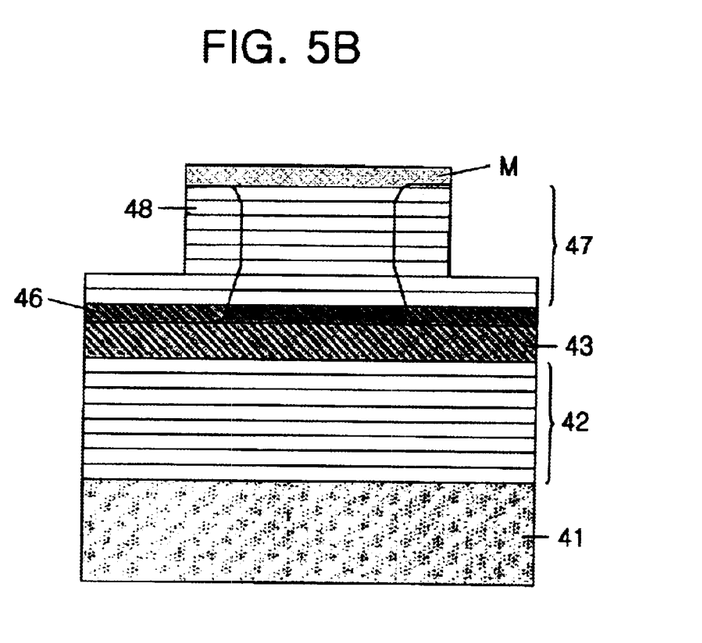

In an ensuing step, a portion of the thickness of the top mirror layer 47 is selectively etched by an ion (beam) etching process employing $BCl_3$, $Cl_2$, $CH_4$, $H_2$ or Ar as gas, thereby form a laser column as shown in FIG. 5B. Thereafter, Zn is diffused to both ends of the top mirror layer 47 on the order of 1 to 10 micrometers in depth through the use of the mask pattern as a diffusion mask, thereby forming a Zn diffusion region 48 having its bottom surface contacted with the p-type current extension layer 46. The Zn diffusion region 48 is formed by the heat-treatment at temperatures ranging from 400° C. to 500° C. together with a sample and $Zn_3P_2$, allowing Zn to be diffused into the sample.

Figure 5C:
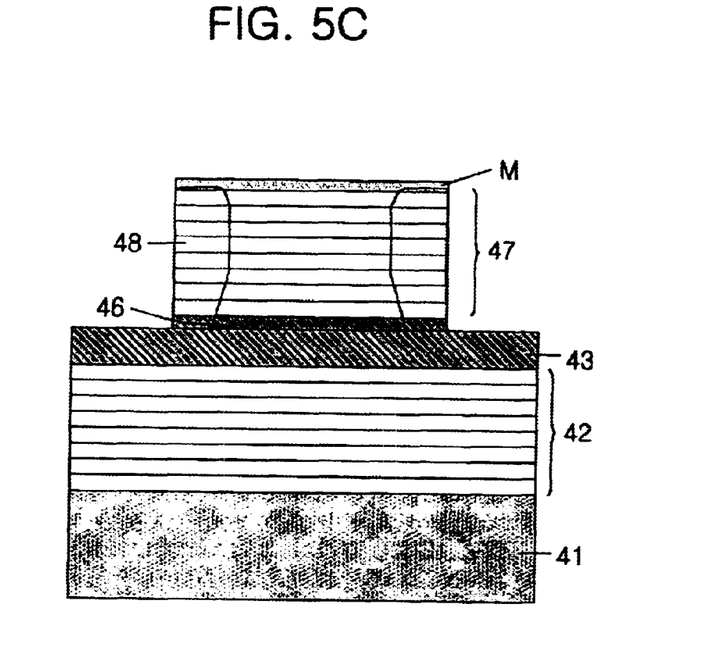

After the above step, the top mirror layer 47 and the current extension layer 46 are etched until the active layer 43 is exposed through the use of an ion (beam) etching process employing $BCl_3$, $Cl_2$, $CH_4$, $H_2$ or Ar as gas, and the mask pattern as an etch mask, as shown in FIG. 5C.

Figure 5D:
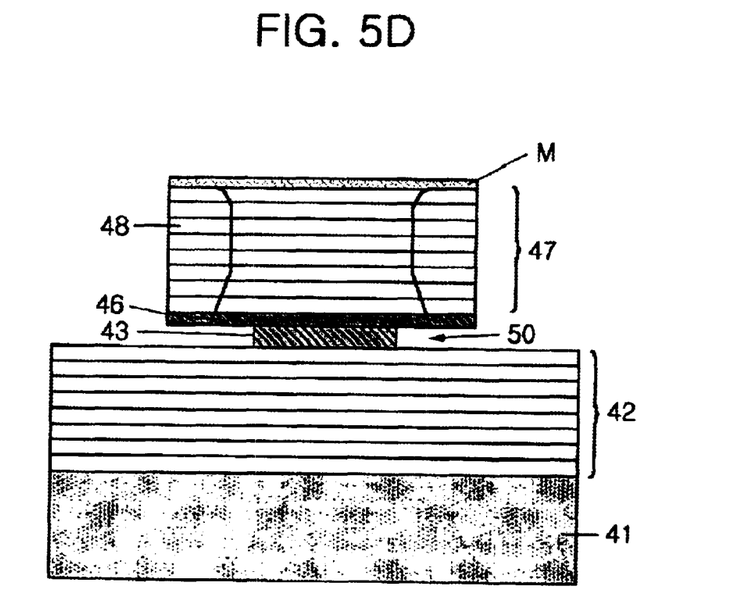

Subsequently, a portion of the active layer 43 is selectively etched using a wet etching process, as shown in FIG. 5D. The remaining portion of the active layer 43 after the wet etching process allows it to be overlapped with the undoped top mirror layer 47 at between the Zn diffusion regions. Specifically, the portion of the active layer 43 is etched to have a small width relative to that of a region where no Zn is diffused within the top mirror layer 47, thereby providing the air layer 50 between the bottom mirror layer 42, the active layer 43 and the current extension layer 46.

Figure 5E:
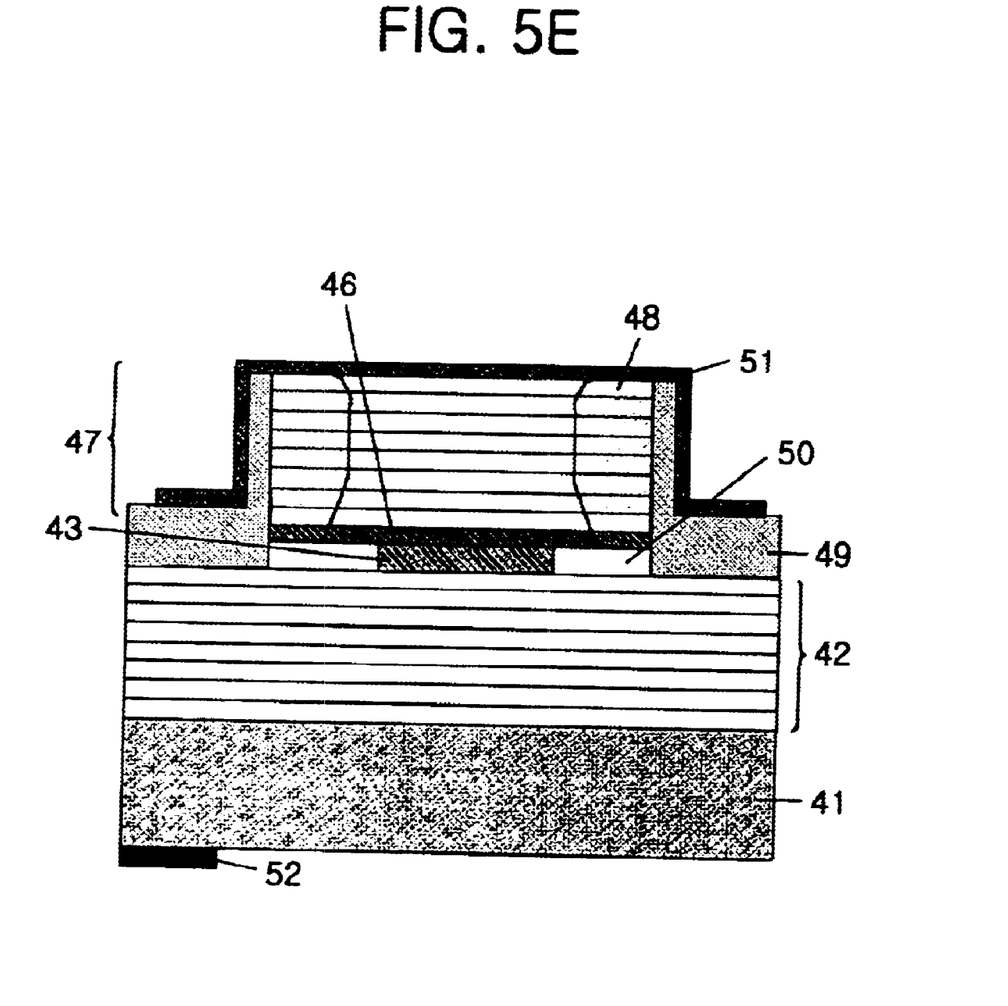

In a subsequent step, as shown in FIG. 5E, the mask pattern M is etched for the removal thereof and then an insulating layer 49 is formed on the overall structure obtained so, wherein the insulating layer 49 is made of a dielectric film or polyimide. And then, the insulating layer 49 is selectively etched to form a pattern which covers a side wall of the top mirror layer 47 and the current extension layer 46 and a surface of the bottom mirror layer 42, thereby providing the air layer 50 between the current extension layer 46, the active layer 43 and the bottom mirror layer 42. After that, a first metal electrode 51 made of Au, Ti/Au or Ti/Pt/Au is connected with the top mirror layer 47 and the reverse side of the InP semiconductor substrate 41 is polished to form a second metal electrode 52 connected with the reverse side. Alternatively, a dielectric thin film may be formed at other place than the second metal electrode 52 to decrease reflection of light from the reverse side according to the reflectivity of the reverse side of the n-type InP semiconductor substrate 41.

As mentioned above, the present invention has the ability to improve the efficiency of long wavelength surface-emitting laser device, to thereby employ it as a high efficiency of surface-emitting laser light source with a low thermal loss and a minimized power consumption.

Furthermore, the present invention has the ability to eliminate a free electron absorption loss in a top mirror layer and minimizes a scattering loss and resistance, to thereby allow an oscillation at an elevated temperature, which, in turn, utilizes it as a long wavelength laser light source with stable characteristics.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A surface-emitting laser device, comprising:
   a first conductive type of semiconductor substrate;
   a bottom mirror layer formed on the semiconductor substrate and composed of a first conductive type of semiconductor layer;
   an active layer formed on the bottom mirror layer;
   an electron leakage barrier layer formed on the active layer and having an energy gap larger than the active layer;
   a current induction layer formed on the electron leakage barrier layer and a second conductive type of semiconductor layer;
   a current extension layer formed on the current induction layer and composed of the second conductive type of semiconductor layer; and
   a top mirror layer formed on the current extension layer, wherein the top mirror layer includes an undoped center portion, and both its ends having the second conductive type of dopant diffusion region.

2. The device as recited in claim 1, wherein the dopant diffusion region is a Zn diffusion region.

3. The device as recited in claim 2, wherein the current extension layer has a larger area relative to the current induction layer.

4. The device as recited in claim 3, wherein the current induction layer is overlapped with the center portion of the top mirror layer.

5. The device as recited in claim 4, further comprising an insulating layer for covering each side well of the top mirror layer and the current extension layer to thereby provide an air layer between its one side, the current extension layer, the current induction layer and the electron leakage barrier layer.

6. The device as recited in claim 2, wherein the top mirror layer and the bottom mirror layer have a layered structure formed by alternatively layering a plurality of semiconductor layers having different indices of refraction.

7. The device as recited in claim 6, further comprising:
a first electrode connected with the top mirror layer; and
a second electrode connected with the semiconductor substrate.

8. The device as recited in claim 2, wherein the active layer includes a quantum well layer and a space layer.

9. The device as recited in claim 6, wherein a thickness of one cycle composed of the plurality of semiconductor layers having different indices of refraction is a half times a laser oscillation wavelength as an optical length.

10. The device as recited in claim 6, wherein the semiconductor substrate is an InP-based substrate; and
wherein each of the bottom mirror layer and the top mirror layer is made of an InAlAs/InAlGaAs, InGaAsP/InP, $In_x(Al_yGa_{1-y})As/In_{x'}(Al_{y'}Ga_{1-y'})_{1x'}As$ and $In_xGa_{1-x}As_yP_{1-y}/In_{x'}Ga_{1-x'}As_{y'}P_{1-y'}$ lattice-matched to InP, wherein x, x', y and y' are real numbers between zero and one, respectively, and x≠x' and y≠y'.

11. The device as recited in claim 8, wherein the active layer is made of InAlGaAs/InAlAs, InAlGaAs/InGaAsP and InAlGaAs/InP; and a thickness of the active layer is ½ integral multiples of the laser oscillation wavelength.

12. The device as recited in claim 11, wherein the current extension layer is composed of a semiconductor layer lattice matched to InP.

13. The device as recited in claim 11, wherein the current induction layer is made of InP, InGaAsP or InAlGaAs lattice matched to InP and has the range of 5 to 50 micrometers in width.

14. A surface-emitting laser device, comprising:
a first conductive type of semiconductor substrate;
a bottom mirror layer formed on the semiconductor substrate and composed of a first conductive type of semiconductor layer;
an active layer formed on the bottom mirror layer;
a current extension layer formed on the active layer and composed of the second conductive type of semiconductor layer; and
a top mirror layer formed on the active layer, wherein the top mirror layer includes an undoped center portion, and both its ends having the second conductive type of dopant diffusion region.

15. The device as recited in claim 14, comprising a current extension layer for covering the active layer, wherein the current extension layer is composed of the second conductive type of semiconductor layer with a larger area relative to the active layer.

16. The device as recited in claim 15, wherein the active layer is overlapped with the center portion of the top mirror layer.

17. The device as recited in claim 16, further comprising an insulating layer for covering each side well of the top mirror layer and the current extension layer to thereby provide an air layer between its one side, the current extension layer, the active layer and the bottom mirror layer.

18. The device as recited in claim 14, wherein the dopant diffusion region is a Zn diffusion region.

19. A method for the fabrication of a surface-emitting laser device, comprising the steps of:
(a) forming a bottom mirror layer composed of a first conductive type of semiconductor layer on a first conductive type of semiconductor substrate;
(b) disposing an active layer on the bottom mirror layer;
(c) sequentially forming on the active layer, an electron leakage barrier layer, a current induction layer and a current extension layer each of which is composed of a second conductive type of semiconductor layer
(d) forming a top mirror layer composed of an undoped semiconductor layer on the current extension layer;
(e) forming a mask pattern on the top mirror layer;
(f) selectively etching a portion of the top mirror layer using the mask pattern as an etch mask to thereby form a laser column composed of the top mirror layer;
(g) forming the second conductive type of dopant diffusion layer at both ends of the top mirror layer using the mask pattern as an etch mask;
(h) etching the top mirror layer and the current extension layer using the mask pattern as the etch mask, until the current induction layer is exposed;
(i) wet etching the current induction layer to form a pattern which overlaps with the top mirror layer at between the second conductive type of dopant diffusion layers; and
(j) removing the mask pattern.

20. The method as recited in claim 19, further comprising, after step (j), the step of forming an insulating layer for covering each side well of the top mirror layer and the current extension layer to thereby provide an air layer between its one side, the current extension layer, the current induction layer and the electron leakage barrier layer.

21. The method as recited in claim 20, wherein at step (c), the current induction layer is made of one of InP and InGaAsP, and each of the electron leakage barrier layer and the current extension layer is made of InAlGaAs;
at step (d), the top mirror layer is made of InAlGaAs; and
at step (i), the current induction layer is wet etched by utilizing a mixed solution of HCl, $H_2O$ and $H_2O_2$.

22. The method as recited in claim 20, wherein at step (c), the current induction layer is made of InAlGaAs, and each of the electron leakage barrier layer and the current extension layer is made of one of InP and InGaAsP;
at step (d), the top mirror layer is made of one of InP and InGaAsP; and
at step (i), the current induction layer is wet etched by utilizing a mixed solution of $H_3PO_4$, $H_2O$ and $H_2O_2$.

23. The method as recited in any one of claims 19, wherein at step (g), the dopant diffusion region is formed by diffusing Zn.

24. The method as recited in claim 23, wherein at step (g), the $Zn_3P_2$ is heat-treated at temperatures ranging from 400° C. to 500° C., and the dopant diffusion region is formed by diffusing Zn into both ends of the top mirror layer.

25. The method as recited in claim 23, wherein at step (a), the bottom mirror layer is formed by alternatively stacking a plurality of the first conductive type of semiconductor layers which is lattice matched to the semiconductor substrate and has different indices of refraction; and
at step (d), the top mirror layer is formed by alternatively stacking a plurality of undoped semiconductor layers having different indices of refraction.

26. The method as recited in claim 23, wherein the mask pattern is formed of a silicon nitride film.

27. The method as recited in claim 23, further comprising the step of forming a first metal electrode connected with the top mirror layer and a second metal electrode connected with the semiconductor substrate.

28. A method for the fabrication of a surface-emitting laser device, comprising the steps of:
  (a) forming a bottom mirror layer composed of a first conductive type of semiconductor layer on a first conductive type of semiconductor substrate;
  (b) disposing an active layer on the bottom mirror layer;
  (c) forming a current extension layer composed of a second conductive type of semiconductor layer on the active layer;
  (d) forming a top mirror layer composed of an undoped semiconductor layer on the current extension layer;
  (e) forming a mask pattern on the top mirror layer;
  (f) selectively etching a portion of the top mirror layer using the mask pattern as an etch mask to thereby form a laser column composed of the top mirror layer;
  (g) forming the second conductive type of dopant diffusion layer at both ends of the top mirror layer using the mask pattern as an etch mask;
  (h) etching the top mirror layer and the current extension layer using the mask pattern as the etch mask, until the active layer is exposed;
  (i) wet etching the active layer to form a pattern which overlaps with the top mirror layer at between the second conductive type of dopant diffusion layers; and
  (j) removing the mask pattern.

29. The method as recited in claim 28, further comprising, after step (j), the step of forming an insulating layer for covering each side well of the top mirror layer and the current extension layer to thereby provide an air layer between its one side, the current extension layer, the active layer and the bottom mirror layer.

30. The method as recited in claim 28, wherein at step (g), the dopant diffusion region is formed by diffusing Zn.

* * * * *